(12) United States Patent
Davie et al.

(10) Patent No.: US 10,120,010 B2
(45) Date of Patent: Nov. 6, 2018

(54) METHOD AND SYSTEM FOR LOCALIZATION ON A DC LIGHTING AND POWER GRID

(75) Inventors: Alan James Davie, Milton (GB); Andrew Alexander Takmakoff, Eindhoven (NL); Paul Richard Simons, Cambridge (GB)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 1079 days.

(21) Appl. No.: 14/238,291

(22) PCT Filed: Aug. 17, 2012

(86) PCT No.: PCT/IB2012/054188
§ 371 (c)(1),
(2), (4) Date: Feb. 11, 2014

(87) PCT Pub. No.: WO2013/024460
PCT Pub. Date: Feb. 21, 2013

(65) Prior Publication Data
US 2014/0191746 A1    Jul. 10, 2014

Related U.S. Application Data

(60) Provisional application No. 61/524,363, filed on Aug. 17, 2011.

(51) Int. Cl.
*G01R 31/02* (2006.01)
*H05B 33/08* (2006.01)
*H05B 37/02* (2006.01)
*G01R 19/00* (2006.01)

(52) U.S. Cl.
CPC ....... *G01R 31/021* (2013.01); *G01R 19/0046* (2013.01); *H05B 33/08* (2013.01); *H05B 37/0263* (2013.01)

(58) Field of Classification Search
CPC .......................... G01R 31/021; G01R 19/0046
See application file for complete search history.

(56) References Cited

U.S. PATENT DOCUMENTS

| 9,504,132 | B2 * | 11/2016 | Aggarwal .......... H05B 37/0245 |
| 2004/0002792 | A1 | 1/2004 | Hoffknecht |
| 2006/0056855 | A1 | 3/2006 | Nakagawa et al. |
| 2008/0037241 | A1 | 2/2008 | Von Der Brelie |

(Continued)

FOREIGN PATENT DOCUMENTS

| JP | 2011517270 A | 5/2011 |
| WO | 2006095315 A1 | 9/2006 |

(Continued)

*Primary Examiner* — Jermele M Hollington
*Assistant Examiner* — Feba Pothen
(74) *Attorney, Agent, or Firm* — Meenakshy Chakravorty

(57) ABSTRACT

The present disclosure is directed to methods and apparatus for locating luminaires within a lighting system where multiple luminaires are located on a grid of DC power rails. The AC signal generator connects to each DC power rail and transmits an AC signal along each DC power rail in turn to luminaires that each compute their distance from the generator based upon the AC signal. The AC signal generator may similarly transmit and receive data communications with luminaires across DC power rails.

14 Claims, 13 Drawing Sheets

(56) References Cited

U.S. PATENT DOCUMENTS

| | | | |
|---|---|---|---|
| 2009/0190921 A1* | 7/2009 | Nakajima | G01M 11/3136 398/13 |
| 2010/0214082 A1 | 8/2010 | Covaro et al. | |
| 2011/0175553 A1* | 7/2011 | Sampsell | H05B 37/0245 315/312 |
| 2013/0127362 A1* | 5/2013 | Trainor | G01R 31/44 315/224 |

FOREIGN PATENT DOCUMENTS

| | | |
|---|---|---|
| WO | 2007102097 A1 | 9/2007 |
| WO | 2007102114 A1 | 9/2007 |
| WO | 2010042219 A2 | 4/2010 |
| WO | 2010064159 A1 | 6/2010 |
| WO | 2010097737 A1 | 9/2010 |

\* cited by examiner

METHOD AND SYSTEM FOR LOCALIZATION ON A DC LIGHTING AND POWER GRID

TECHNICAL FIELD

The present invention is directed generally to illumination systems. More particularly, various inventive methods and apparatus disclosed herein relate to lighting and power distribution systems.

BACKGROUND

Digital lighting technologies, i.e. illumination based on semiconductor light sources, such as light-emitting diodes (LEDs), offer a viable alternative to traditional fluorescent, HID, and incandescent lamps. Functional advantages and benefits of LEDs include high energy conversion and optical efficiency, durability, lower operating costs, and many others. Recent advances in LED technology have provided efficient and robust full-spectrum lighting sources that enable a variety of lighting effects in many applications.

Traditional lighting installations, particularly in office spaces and other similar environments, have typically adopted a simple point-to-point connection methodology, where power is supplied to each luminaire via a dedicated, but essentially "free floating", power cable. These power cables, which, in many regions, carry a high AC voltage, for example, 240V, typically hop from luminaire to luminaire, in a generally ad hoc manner, until all lamps are included in the system. In addition, each luminaire often requires the installation of a separate switch cable that connects each lamp or fitting to a dedicated control switch or bank of switches.

In a typical office lighting installation, luminaires are usually placed in a rectangular grid pattern, however, the cable routing above the ceiling, needed to supply these luminaire grids are by contrast very often quite irregular in their placement. In many cases the placement and routing of the power cables is left to the discretion of individual installers.

To help address this situation, a standard is being developed within an alliance called "EMerge," an open industry association developing standards leading to the rapid adoption of DC power distribution in commercial buildings. The EMerge standard proposes the use of safe, low voltage (24V dc) power distribution and a more structured power supply scheme based on the use of rigid bus bars running above the ceiling. This system facilitates simplified and safe removal, connection, or re-location of lights in a lighting system. Also, because the bus bar system can be organized in a grid structure above the ceiling, it may be more suitable for connection with a luminaire grid that it provides power to. An example of a section of the proposed EMerge power supply bus bar, and the connectors needed to supply power to individual luminaires, and other devices in an office ceiling, are shown in FIG. 1.

Since the EMerge standard has been designed to make it easier for users to move and reconfigure lighting installations on-the-fly, it is desirable to ensure that luminaires can be easily associated and disassociated with control switches. To that end, EMerge proposes the use of wireless communications systems (currently ZigBee), rather than physical wires, to connect luminaires with user operated control points, for example, wall switches.

While traditional point-to-point style wiring strategies have very little impact on day-to-day use of office lighting installations, they present significant drawbacks regarding installing and commissioning lighting systems. Further, the point-to-point cabling used for an initial system may not be suitable for future modifications.

A major difficulty with commissioning any new lighting system is how to accurately map luminaires with control units or switches. For example, routing the wiring between a particular switch on the wall to the luminaire it controls in the ceiling. Traditionally the whole commissioning process is completely manual. The installer needs to first associate luminaires in the ceiling with luminaires indicated in a lighting plan and ensure that said luminaire is hard wired to whichever switch has also been indicated on the plan as being the control point for that lamp. In the case of traditionally wired systems this process is slow and laborious. Situations become more difficult when it becomes desirable to control traditionally wired luminaires by wireless means. In this case it becomes necessary for the installation engineer to record the unique wireless identifier (ID number) associated with each luminaire and to transfer that information to the lighting plan. When wireless lighting controls, such as switches, are then installed, it similarly becomes necessary to transfer the switch ID details to the lighting plan. The next step in the process is typically to manually create a binding table somewhere in the control system to associate switches with luminaires. Finally, the system needs to be tested to ensure that the desired binding have been allocated correctly.

Therefore, it is desirable to simplify the controller-luminaire mapping process. For example, the luminaire and control point mapping process could be automated, if the physical location of every luminaire in the ceiling was provided to the system.

Currently, many conventional technical solutions for locating objects employ wireless technologies, such as ZigBee or WiFi. Within this general category of solutions, the two most common systems to be found are either signal strength based or time of flight based.

Radio location systems that use signal strength as the basis for their measurement, for example those produced by AeroScout and Ekahau, are generally relatively easy to implement at modest cost, but have rather poor intrinsic accuracy, varying by perhaps five meters from of the true location. Accuracy can be improved with a technique known as finger printing, which involves measuring the signal strength at every point in a room in advance. However, the process is laborious to carry out and the resulting finger print profile may change with minor alterations within the room, for example moving furniture.

Location systems based on time of flight, such as those, for example, developed by UbiSense of Cambridge, United Kingdom, can achieve much greater accuracy than signal strength based alternatives, however, they are complex and expensive to implement, and can still suffer from accuracy or reliability problems due to propagation effects such as multipath or fading. EMerge supports wireless communication with each luminaire on the DC grid. Such communication may be used to control functions of each luminaire, for example, on/off state, intensity and color selection. However, it may be costly and cumbersome to equip each luminaire with a wireless transceiver and to configure wireless communication with each luminaire.

Thus, there is a need in the art to simply and cost effectively obtain and monitor the location of luminaires in a lighting system. Further there is a need for simpler and more cost effective control communication with luminaires in a lighting system.

SUMMARY

The present disclosure is directed to inventive methods and apparatus for locating luminaires within a lighting system. For example, embodiments of the present invention relate to systems and methods where multiple luminaires are located on a grid of DC power rails. A single AC signal generator may work in concert with a multiplexer that selects each DC power rail in round-robin fashion. The AC signal generator transmits an AC signal along each DC power rail in turn to luminaires that each computes their distance from the generator based upon the AC signal. Specific embodiments correspond to signal types that may be used for the luminaire to calculate the distance between the generator and the luminaire. Each luminaire may include AC signal receiver circuitry, logic circuitry capable of calculating the distance based on the received signal, memory to store the calculated distance, and a means for transmitting that distance to a room controller. Each luminaire may calculate and store the distance and then communicate that distance to a room controller or similar device. These embodiments leverage existing power infrastructure and layout to add location and communication features with high precision and relatively low additional cost and complexity.

In addition, the AC signal generator may transmit and receive data communications with luminaires across DC power rails. Such data communications may be used in place of, or in concert with, other data communications channels between individual luminaires and an internal or external controller.

Generally, in a first aspect, a method for locating a luminaire on a DC grid includes a first DC grid power line, an AC signal generator switchably connected to the first DC grid power line, and a first luminaire in electrical communication with the first DC grid power line. The first luminaire is disposed along the first DC grid power line at a first distance from the AC signal generator. The method includes the steps of connecting the AC signal generator to the first DC grid power line, transmitting, by the AC signal generator, an AC signal along the first DC grid power line, receiving the AC signal by the first luminaire, and calculating the first distance between the AC signal generator and the first luminaire, based in part upon the AC signal.

In a first embodiment, the first DC grid power line is terminated for the AC signal with a resistance approximating a characteristic impedance of the first DC grid power line. Under the first embodiment, the method further includes the steps of recording, by the first luminaire, a first phase of the AC signal at the first luminaire, and recording, by the AC signal generator, a second phase of the AC signal at the AC signal generator. The step of calculating the first distance further includes measuring a difference between the first phase and the second phase.

In a second embodiment, the first DC grid power line is unterminated for the AC signal. The method includes the steps of setting the frequency of the AC signal such that the AC signal forms a standing wave across the first DC grid power line, the standing wave including a maximum amplitude, and recording, by the first luminaire, a first amplitude of the AC signal at the first luminaire. The step of calculating the first distance further includes measuring a difference between the first amplitude and the maximum amplitude.

In a third embodiment under the first aspect, the first DC grid power line is unterminated for the AC signal, and the AC signal has an amplitude. The method of the first aspect further includes the steps of sweeping the frequency of the AC signal between a first frequency and a second frequency, recording, by the first luminaire, a first time corresponding to a time the first luminaire initially detects the AC signal, and recording, by the first luminaire, a second time corresponding to a time the first luminaire detects the amplitude of the AC signal corresponding to a null amplitude. The step of calculating the first distance further includes measuring a difference between the first time and the second time.

In a fourth embodiment under the first aspect, the AC signal is a pulse signal, and the first DC grid power line is unterminated for the AC signal. The method further includes the steps of recording, by the first luminaire, a first time corresponding to a time the first luminaire initially detects the pulse signal, and recording, by the first luminaire, a second time corresponding to a time the first luminaire initially detects a reflection of the pulse signal. The step of calculating the first distance further includes measuring a difference between the first time and the second time.

Under a first version of the first aspect, the DC grid further has a second DC grid power line, the AC signal generator switchably connected to the second DC grid power line, and a second luminaire in electrical communication with the second DC grid power line. The second luminaire is disposed along the second DC grid power line at a second distance from the AC signal generator. The method includes the steps of connecting the AC signal generator to the second DC grid power line, transmitting, by the AC signal generator, an AC signal along the second DC grid power line, receiving the AC signal by the second luminaire, and calculating the second distance between the AC signal generator and the second luminaire, based in part upon the AC signal.

Under a second version of the first aspect, the DC grid includes a memory element. The method further includes the steps of storing the first distance in the memory and communicating the first distance to a DC grid mapper. The step of communicating the first distance to the DC grid mapper may include transmitting a wireless signal to the DC grid mapper. The memory may optionally be disposed within the first luminaire, where the DC grid mapper is in electrical communication with the DC grid. The step of communicating the first distance to a DC grid mapper may include the step of transmitting a communication signal along the first DC grid power line from the first luminaire to the DC grid mapper.

Generally, in a second aspect, the invention relates to a system that includes a DC power grid including a plurality of DC power lines, with an AC signal generator switchably connected to at least one of the plurality of DC grid power lines. The AC signal generator is configured to transmit a locator signal along at least one of the plurality of DC grid power lines. A plurality of luminaires is disposed upon the DC power grid. Each of the luminaires includes a receiver configured to receive the locator signal, logic circuitry configured to calculate a distance between the luminaire and the AC signal generator based on the locator signal, memory configured to store the distance, and means for transmitting the distance to a room controller. Under one embodiment, the DC grid is an Emerge compliant lighting system.

Under a second embodiment, the AC signal generator is configured to transmit the locator signal within a first frequency band and further configured to transmit and receive data within a second frequency band. 17. The plurality of luminaires are configured to receive the locator signal within the first frequency band and further configured to receive data within the second frequency band. The locator signal may optionally be a standing wave or a pulse.

Generally, a third aspect of the invention relates to a method having the steps of providing a DC power grid including a plurality of DC power lines and a plurality of luminaires disposed upon the plurality of DC power lines, selecting a first luminaire from the plurality of luminaires, assigning an ID to the first luminaire, associating the first luminaire with a first DC power line, storing a first coordinate index including the association between the first luminaire and the first DC power line, calculating a position of the first luminaire in relation to the first DC power line, storing a second coordinate index including the position of the first luminaire in relation to the first DC power line, and communicating the ID, the first coordinate index and the second coordinate index to a room controller.

Generally, a fourth aspect is a method for controlling a first luminaire in electrical communication with a first DC grid power line on a DC grid. The first luminaire includes a first luminaire data transceiver. The DC grid includes the first DC grid power line, a grid data transceiver switchably connected to the first DC grid power line, and the first luminaire. The method includes the steps of connecting the grid data transceiver to the first DC grid power line, transmitting, by the grid data transceiver, a first data signal along the first DC grid power line, receiving the first data signal by the first luminaire data transceiver.

In a first embodiment under the fourth aspect, the DC grid further including the steps of transmitting, by the first luminaire data transceiver, a second data signal along the first DC grid power line, and receiving the second data signal by the grid data transceiver.

In a second embodiment of the fourth aspect, the DC grid further includes a second DC grid power line, and a second luminaire in electrical communication with the second DC grid power line. The second luminaire includes a second luminaire data transceiver. The grid data transceiver is switchably connected to the second DC grid power line. The method further includes the steps of connecting the grid data transceiver to the second DC grid power line, transmitting, by the grid data transceiver, a third data signal along the second DC grid power line, and receiving the third data signal by the second luminaire data transceiver.

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, and the like. In particular, the term LED refers to light emitting diodes of all types (including semi-conductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers). Some examples of LEDs include, but are not limited to, various types of infrared LEDs, ultraviolet LEDs, red LEDs, blue LEDs, green LEDs, yellow LEDs, amber LEDs, orange LEDs, and white LEDs (discussed further below). It also should be appreciated that LEDs may be configured and/or controlled to generate radiation having various bandwidths (e.g., full widths at half maximum, or FWHM) for a given spectrum (e.g., narrow bandwidth, broad bandwidth), and a variety of dominant wavelengths within a given general color categorization.

The term "light source" should be understood to refer to any one or more of a variety of radiation sources, including, but not limited to, LED-based sources (including one or more LEDs as defined above), incandescent sources (e.g., filament lamps, halogen lamps), fluorescent sources, phosphorescent sources, high-intensity discharge sources (e.g., sodium vapor, mercury vapor, and metal halide lamps), lasers, other types of electroluminescent sources, pyro-luminescent sources (e.g., flames), candle-luminescent sources (e.g., gas mantles, carbon arc radiation sources), photo-luminescent sources (e.g., gaseous discharge sources), cathode luminescent sources using electronic satiation, galvano-luminescent sources, crystallo-luminescent sources, kine-luminescent sources, thermo-luminescent sources, triboluminescent sources, sonoluminescent sources, radioluminescent sources, and luminescent polymers.

The term "lighting fixture" or "luminaire" is used herein to refer to an implementation or arrangement of one or more lighting units in a particular form factor, assembly, or package. The term "lighting unit" is used herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s). An "LED-based lighting unit" refers to a lighting unit that includes one or more LED-based light sources as discussed above, alone or in combination with other non LED-based light sources.

The term "controller" is used herein generally to describe various apparatus relating to the operation of one or more light sources. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

The term "addressable" is used herein to refer to a device (e.g., a light source in general, a lighting unit or fixture, a controller or processor associated with one or more light sources or lighting units, other non-lighting related devices, etc.) that is configured to receive information (e.g., data) intended for multiple devices, including itself, and to selectively respond to particular information intended for it. The term "addressable" often is used in connection with a networked environment (or a "network," discussed further below), in which multiple devices are coupled together via some communications medium or media.

In one network implementation, one or more devices coupled to a network may serve as a controller for one or more other devices coupled to the network (e.g., in a master/slave relationship). In another implementation, a networked environment may include one or more dedicated controllers that are configured to control one or more of the devices coupled to the network. Generally, multiple devices coupled to the network each may have access to data that is present on the communications medium or media; however, a given device may be "addressable" in that it is configured to selectively exchange data with (i.e., receive data from and/or transmit data to) the network, based, for example, on one or more particular identifiers (e.g., "addresses") assigned to it.

The term "network" as used herein refers to any interconnection of two or more devices (including controllers or processors) that facilitates the transport of information (e.g. for device control, data storage, data exchange, etc.) between any two or more devices and/or among multiple devices coupled to the network. As should be readily appreciated, various implementations of networks suitable for interconnecting multiple devices may include any of a variety of network topologies and employ any of a variety of communication protocols. Additionally, in various networks according to the present disclosure, any one connection between two devices may represent a dedicated connection between the two systems, or alternatively a non-dedicated connection. In addition to carrying information intended for the two devices, such a non-dedicated connection may carry information not necessarily intended for either of the two devices (e.g., an open network connection). Furthermore, it should be readily appreciated that various networks of devices as discussed herein may employ one or more wireless, wire/cable, and/or fiber optic links to facilitate information transport throughout the network.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

As mentioned above, there is a need to map the locations of luminaires disposed within a lighting system, for example, luminaires incorporated within an EMerge lighting grid. The approach described below aims to offer an alternative method to address the luminaire location problem.

More generally, Applicants have recognized and appreciated that it would be beneficial to provide more accurate luminaire location mapping than time of flight based radio systems that are easier and less expensive to implement than signal strength based systems. Also, since the invention avoids the need to transmit radio signals to make ranging measurements, it may be less susceptible to changing propagation environments that characterize many indoor locations.

In view of the foregoing, various embodiments and implementations of the present invention are directed to systems and methods for locating luminaires within a DC power grid. While the invention as described here makes use of the regular grid structure as proposed by the EMerge specification to locate luminaires in a lighting installation, the invention is not limited to using the Emerge specification. For example, the invention is applicable in other systems where the position of the power supply lines is known and the power supply lines are suitable for AC signal transmission.

DC Grid

Figure 1:
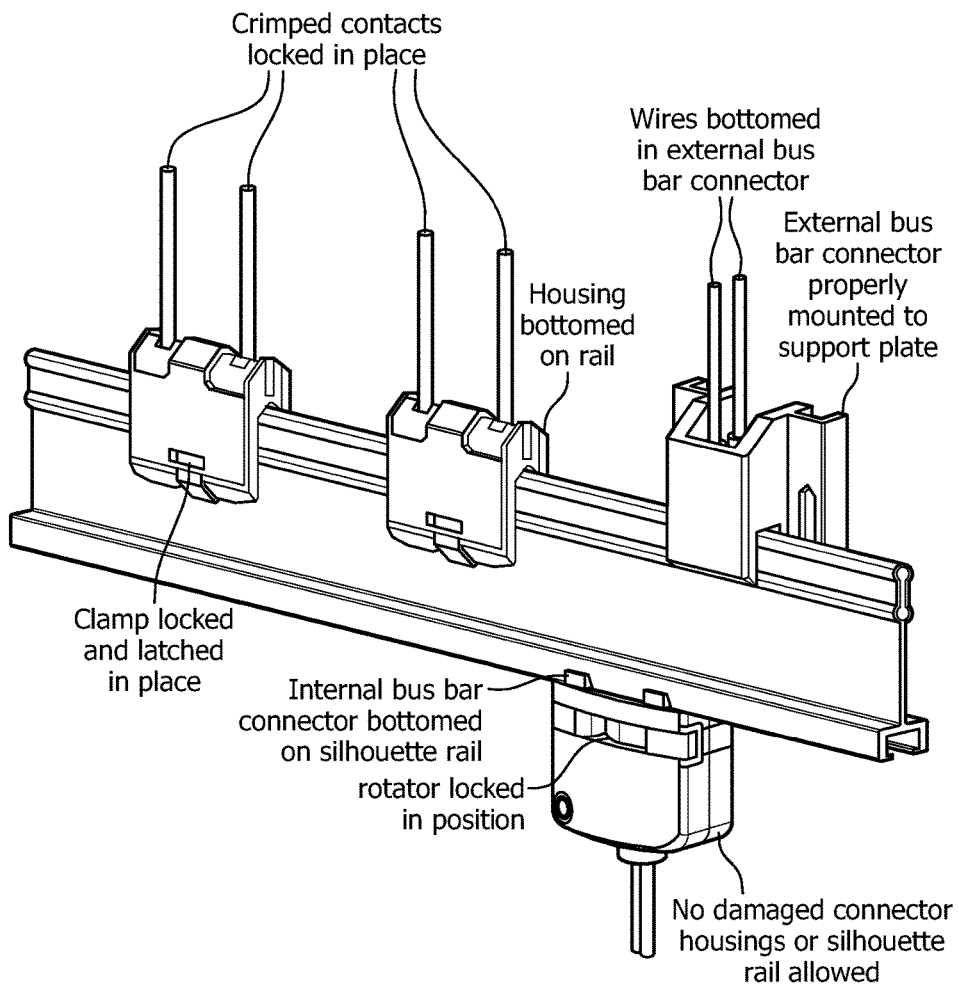
FIG. 1 illustrates an example implementation of an EMerge power bus bar and connectors for supplying luminaires and peripherals.
Figure 2A:
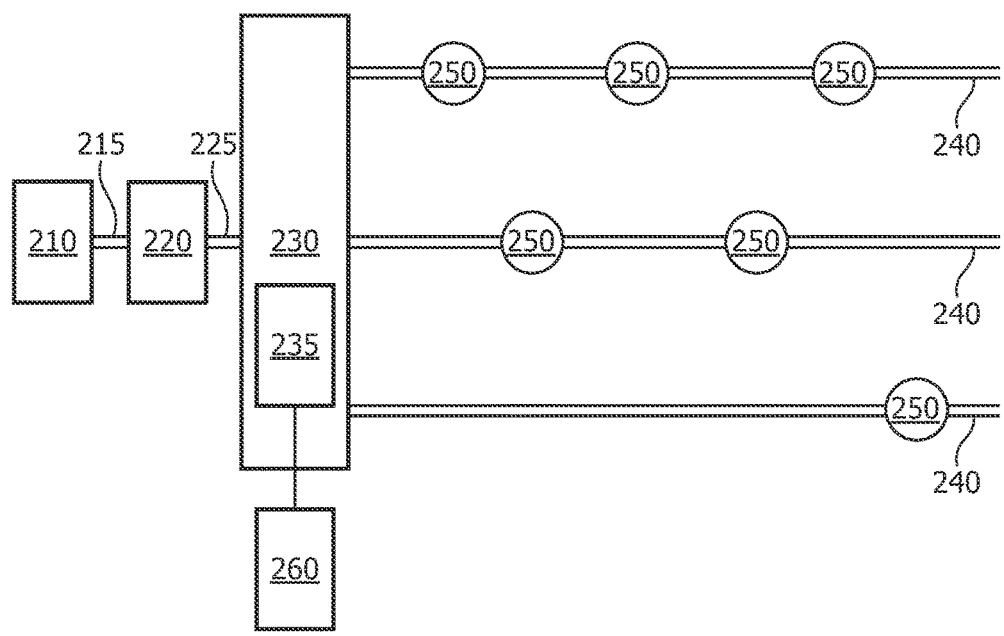
FIG. 2A is a schematic diagram of an exemplary luminaire location system.

A first exemplary embodiment of a DC grid, for example, as proposed within the EMerge standard, is shown in FIG. 2A. The DC grid includes an AC to DC converter 220, or transformer, for example, to convert the incoming high voltage (110V/240V) from an AC power supply 210 to low voltage (24V) DC as conveyed by a high voltage power line 215. The output from the converter 220 is in turn connected to a series of parallel bus bars, or grid lines 240, which together form the underlying grid structure of the lighting installation. Multiple luminaires 250 are connected on grid lines 240 at arbitrary positions on each grid line 240. As described below in this disclosure, the grid lines 240 of an Emerge system distribute power to the luminaires 250, and may also have the electrical characteristics of transmission lines. For example, bus bar configuration proposed in the EMerge standard include two parallel conductors separated over their entire length by insulating material of relatively narrow cross section.

The DC power may be distributed across the grid lines 240, for example, in parallel fashion. A multiplexer 230 may be used to connect a communications transceiver 235, for example, a signal generator, to each grid line 240, so that the multiplexer 230 electrically connects the communications transceiver 235 to a selected grid line 240, or may disconnect the communications transceiver 235 from the grid line 240. As will be explained further, the communications transceiver 235 may be used to transmit and/or receive location signals and/or data communications signals, for example, control messages, across the grid lines 240 to the luminaires 250. Such data communication signals may be conveyed to a room controller 260. The room controller 260 may include a DC grid mapper for determining and storing locations of luminaires 250 in the lighting system, and may be located in close proximity or integrated with the multiplexer 230, or may be external to the multiplexer 230.

Figure 2B:
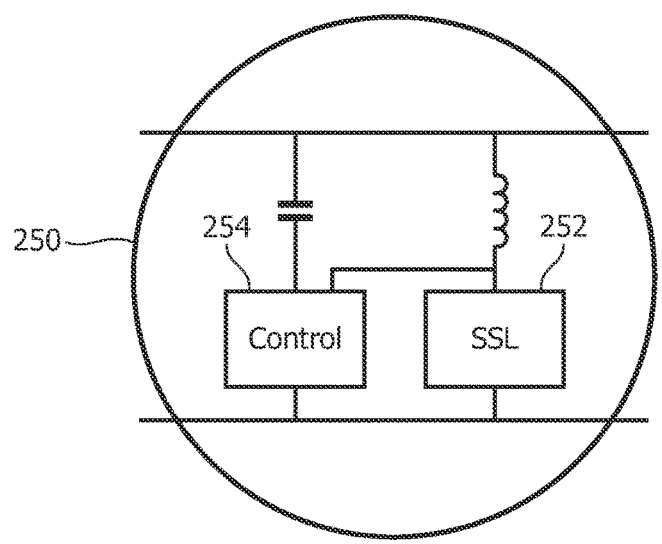
FIG. 2B is a simple diagram of exemplary AC signaling and DC power separation circuitry.

FIG. 2B is a simplified diagram of a luminary 250 indicating circuitry for separating DC power to the solid state luminaire (SSL) 252 from AC signals that may be received by a transceiver 254.

Standard transmission line theory states that for a parallel conducting line of this type, the characteristic impedance ($Z_0$) is given by $$Z_0 = \frac{120}{\sqrt{K}} \ln\left(\frac{2S}{d}\right) \quad \text{Eq. 1}$$

where:
K is the relative dielectric constant of the material between the two conductors
S is the center-to-center separation of the two conductors
d is the diameter of the wires.

Figure 3:
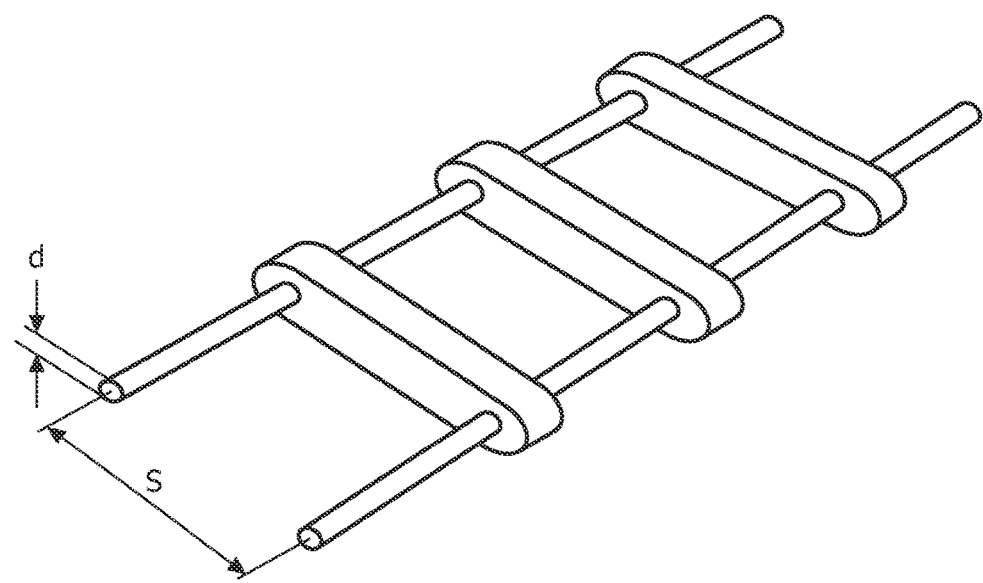
FIG. 3 is a diagram detailing the physical transmission characteristics of power bus bars under the Emerge standard.

For example, referring to FIG. 3, the EMerge specification suggests for typical bus bars, or rails, may have the following dimensions:
S=approximately 6.35 mm;
D=approximately 4 mm;
K=approximately 3.8 (for typical insulating material such as Polybutylene Terephthalate—PBT).

That means that $Z_0$ may be approximately 71Ω, which is close to typical coaxial cable $Z_0$ values of 50Ω/75Ω. Therefore, the DC power rails as specified by the EMerge specification and other power distribution systems may be suitable for transmitting AC signals, for example, location signals and/or data communication signals.

When high frequency signals are superimposed on the DC power voltage, for example, 24V, for luminaire localization or to convey control signals, power may be separated from localizing and/or control signals in the luminaire. For example, this separation may be accomplished by inserting passive AC & DC blocks into the luminaire to allow DC power to reach the lamp and AC signaling frequencies to reach the internal control logic, as shown in FIG. 2B.

Figure 4:
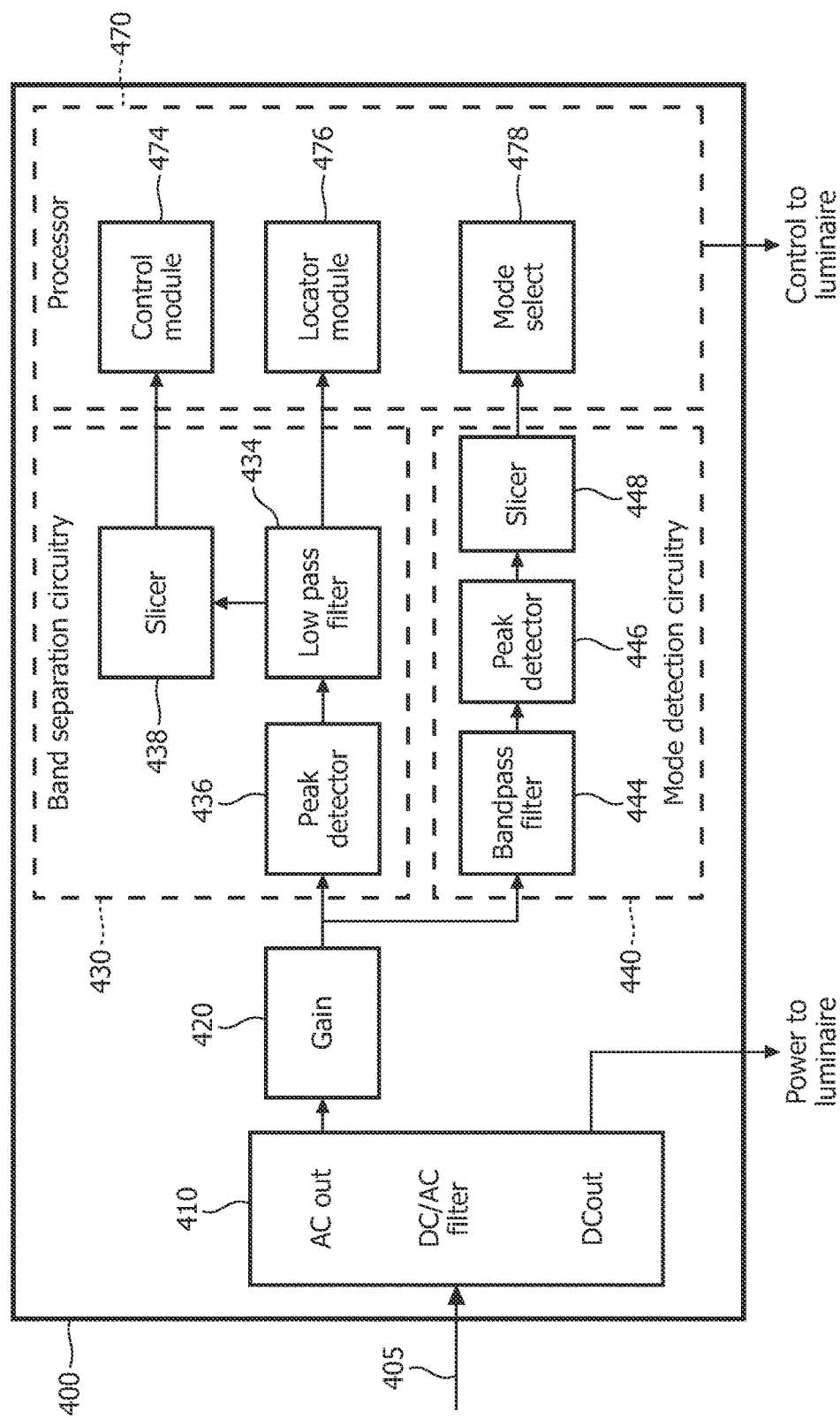
FIG. 4 is a schematic diagram of exemplary AC signaling and DC power separation circuitry.

FIG. 4 shows an exemplary embodiment of a power and signal separation circuit 400 in more detail. An input 405 including DC power and location and/or control signal is transported by a DC power conduit. A DC/AC filter 410 separates the DC power from the AC location/control signal. The location/control signal is then amplified by a gain stage 420, and then routed to mode detection circuitry 440 and band separation circuitry 430. The band separation circuitry 430 may include a peak detector 436, a low pass filter 434 and a first slicer 438. The output of the first slicer 438 may contain a communications channel containing control messaging, and is routed to a control module 474 in a processor 470. The output of the low pass filter 434 may contain localization signals, and may be routed to a locator module 476 in the processor 470.

The mode detection circuitry 440 may be used to determine whether the AC location/control signal is currently carrying a location signal or a data communications signal. The signal is processed by a band pass filter 444, a peak detector 446, and a second slicer 448, before being routed to a mode select block 478 in the processor 470. The mode select block 478 may indicate whether the signal is a locations signal or a communications signal. Of course, a person skilled in the art will recognize that other embodiment may be used to partition DC power, AC location and AC communications signal within the scope of this disclosure.

In general, an exemplary method for localization of luminaires on a DC grid may include two steps. The first step may determine which of the many parallel grid lines that the luminaire is located. For example, this may include determining a grid line number. The result from the first step above may be a digitized result where luminaires are located in integer grid positions. For example, in a first embodiment of luminaires on a DC grid shown by FIG. 2A, three discrete DC power rails 240 are depicted and six luminaires 250 are shown distributed among those power rails 250. If the grid numbering starts with top rail 240, three luminaires 250 are located on the top rail 240, two luminaires 250 are on the middle rail 240, and a single luminaire 250 is on the bottom rail 240. For example, the top rail 240 may be designated as rail 1, the center rail 240 may be designated as rail 2, and the bottom rail 240 may be designated as rail 3.

The second step may determine where on a given grid line a luminaire is located. For example, the second step may entail determining how far a luminaire is located from the end of the grid line as determined in the first step. In addition the luminaire may store its position, and then report its position, for example, when queried by an external controller.

The first step may be implemented by the following example. The multiplexer 230 connects the AC signal transceiver 235 to a first rail 240. A wake-up signal from the AC signal transceiver 235 to the luminaire 250 may contain coded information to identify a rail number of the rail 240 connecting the AC signal transceiver 235 to the luminaire 250, for example to inform the luminaire 250 which rail 240 the luminaire 250 is connected to. Each luminaire 250 is woken up by the wake-up signal, and after a random back-off, each luminaire 250 may communicate a unique luminaire ID number to the AC signal transceiver 235 connected to the multiplexer 230. The luminaire 250 may communicate the luminaire ID to the AC signal transceiver 235 using, for example, Zigbee. The transceiver 235 receives the ID number of each responding luminaire 250 and stores it in a luminaire table indexed by the rail number. Each luminaire may decode the rail number that is encoded in the wake-up signal and store the grid number location locally in the luminaire 250. The multiplexer 230 then selects the next rail 240 in sequence so the transceiver 235 may transmit the wake-up signal to luminaires 250 on the next rail 240. Note that while in the example above the luminaire transmitted the luminaire ID across the rail, there is no objection to the luminaire using other mechanisms to communicate the luminaire ID to a luminaire table, for example, using a wireless signal.

After the multiplexer 230 has connected to each rail in turn, the luminaire table is available to the lighting system that describes which luminaire 250 is associated with which rail 240. The luminaire table may then be populated with localization information for each luminaire 250 describing the distance along the rail between each luminaire 250 and the AC signal transceiver 235, as described below.

Unlike step 1 above, the results of this location process of step 2 may be continuous in nature in that a luminaire may be located at any position along a given power rail. To achieve a location determination in this case involves treating each rail as a transmission line. Transmitting location signals of the appropriate waveform and frequency along the line and monitoring signals at luminaire attachment points may determine the location of a luminaire.

Figure 5:
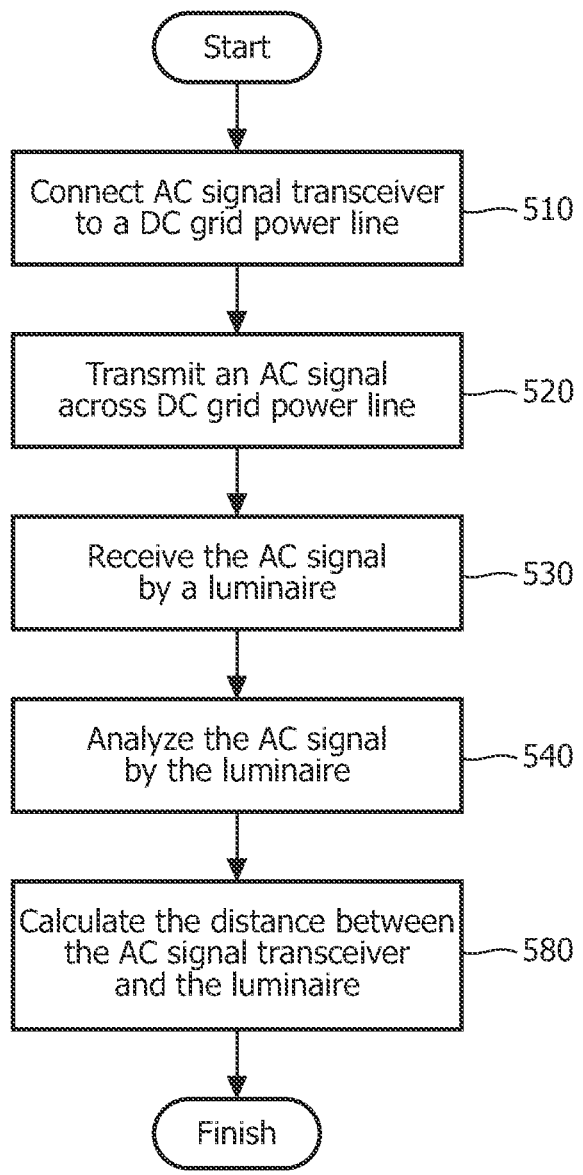
FIG. 5 is a flowchart of a first exemplary method for locating a luminaire on a DC power grid.

A generalized embodiment of a method for localization of luminaires on a DC grid is shown by a block diagram in FIG. 5. It should be noted that any process descriptions or blocks in flow charts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

For exemplary purposes, the localization method shown in FIG. 5 makes reference to the grid system shown by FIG. 2A. The multiplexer 230 (FIG. 2A) at one end of each rail 240 (FIG. 2A). The multiplexer 230 (FIG. 2A) may connect the AC signal transceiver 235 (FIG. 2A) to a rail 240 (FIG. 2A), as shown by block 510. An AC locator signal may be transmitted across the DC rail, as shown by block 520. Several embodiments of AC locator signals are described below. The AC locator signal is received by a luminaire, as shown by block 530. The luminaire analyzes the AC locator signal, as shown by block 540, to calculate the distance between the luminaire and the AC signal transceiver, as shown by block 580.

Four specific embodiments of location methods using the generalized embodiment described above are described below.

Embodiment 1: Phase Difference

Figure 6:
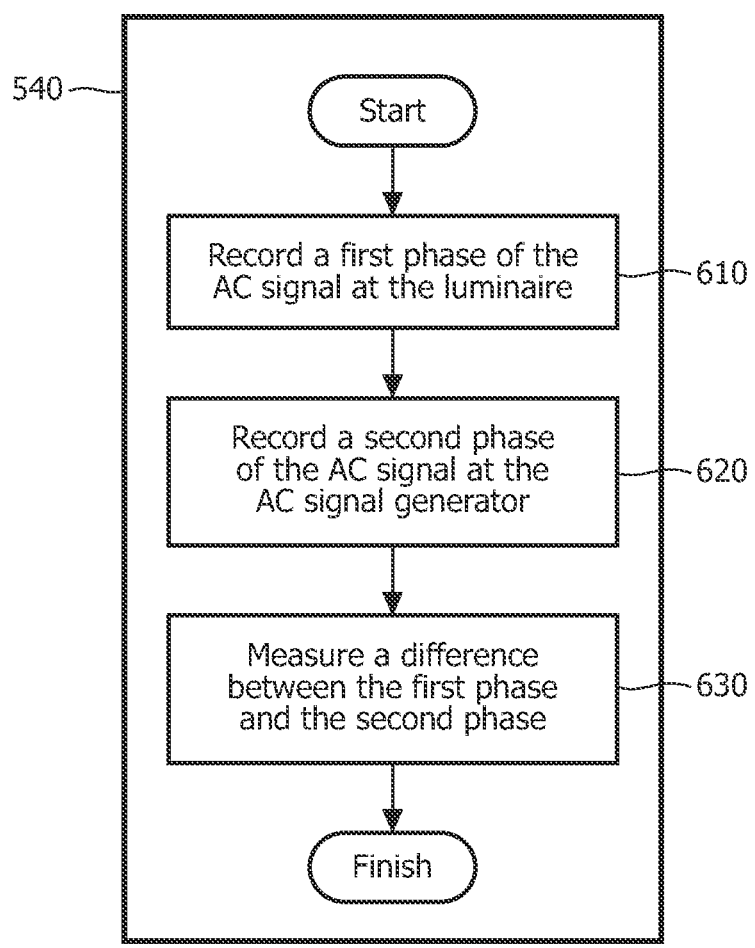
FIG. 6 is a flowchart of a first embodiment of a method for locating a luminaire on a DC power grid.

FIG. 6 is a flowchart expanding and detailing block 540 of FIG. 5 for a first embodiment of a luminaire location method. The first embodiment calculates the distance of the luminaire from the AC signal generator based upon the differences in phase of a signal at different locations along the transmission line, or rail. Under the first embodiment, the AC signal generator transmits a periodic wave, for example, a sine wave, across a DC power rail, as shown by block 520 (FIG. 5). A first phase of the AC signal is recorded at the luminaire, as shown by block 610. A second phase of the AC signal is recorded at the AC signal generator, as shown by block 620. A phase difference between the first phase and the second phase is calculated, as shown by block 630.

Figure 7:
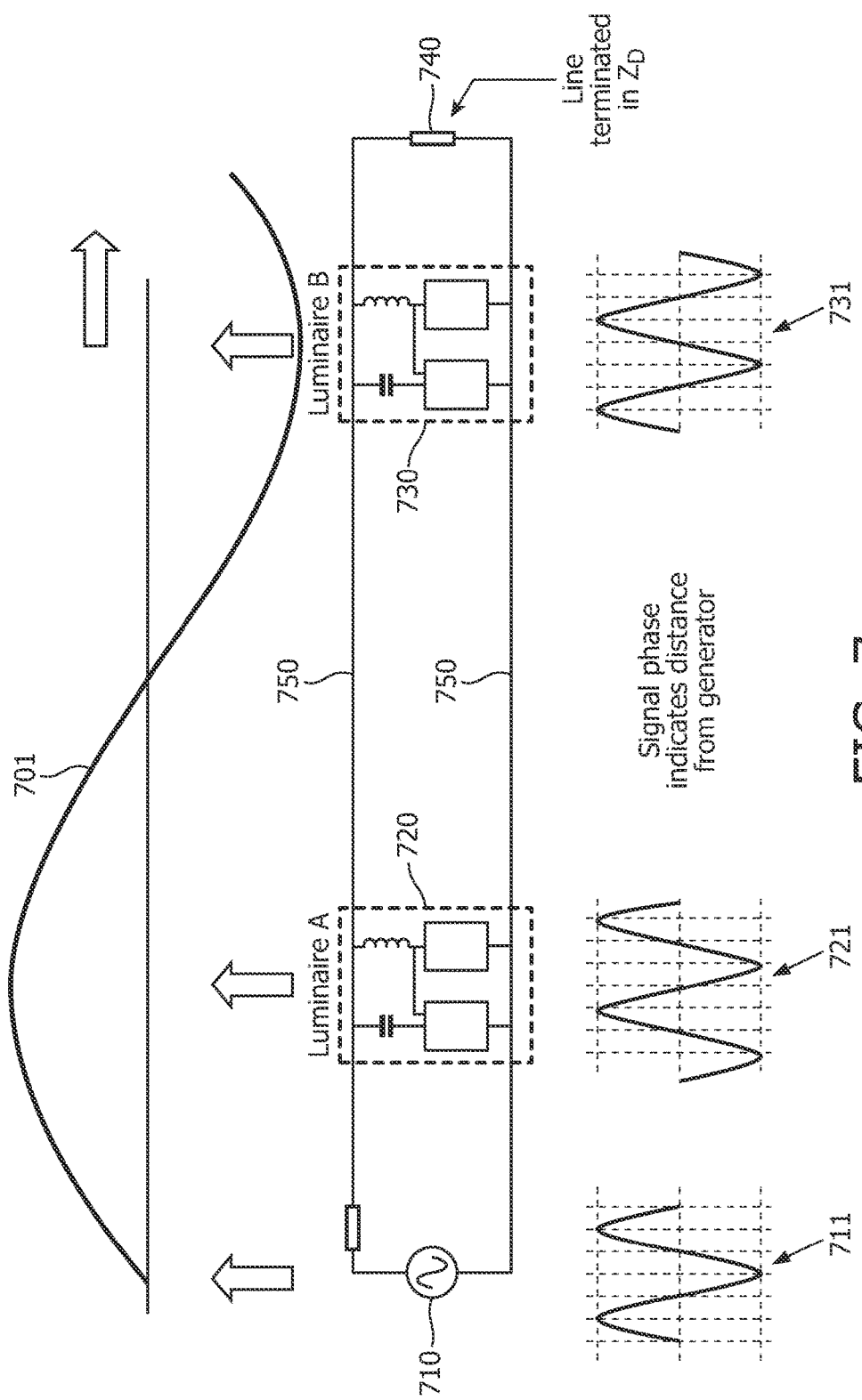
FIG. 7 is a schematic diagram of a first embodiment of a method for locating a luminaire on a DC power grid.

FIG. 7 illustrates an example of signals received at a first luminaire 720 and a second luminaire 730 under the first embodiment, measuring phase differences. Here the grid line 750 is terminated in a resistance 740 approximating the characteristic impedance of the line 750. A high frequency signal 701 is then sent down the line 750. Because no reflections should theoretically be present, each position on the grid will yield a sine wave whose phase angle increases relative to the distance between the signal generator 710 and the luminaires 720, 730 along the line 750.

The position along the line may be calculated by comparing phase differences. A first signal plot 711 represents the phase of the high frequency signal 701 at the signal generator 710. Similarly, a second signal plot 721 represents the phase of the high frequency signal 701 at the first luminaire 720, and a third signal plot 731 represents the phase of the high frequency signal 701 at the second luminaire 730. Since phase measurements are by their nature relative, the distance between the luminaires 720, 730 and the signal generator 710 may not be precisely determined using phase differences alone. Therefore, it may be necessary to use the first embodiment technique in connection with another technique or technology, for example, a coded light, to establish a common timing between all the luminaires on the bus.

Embodiment 2: Amplitude Difference

Figure 8:
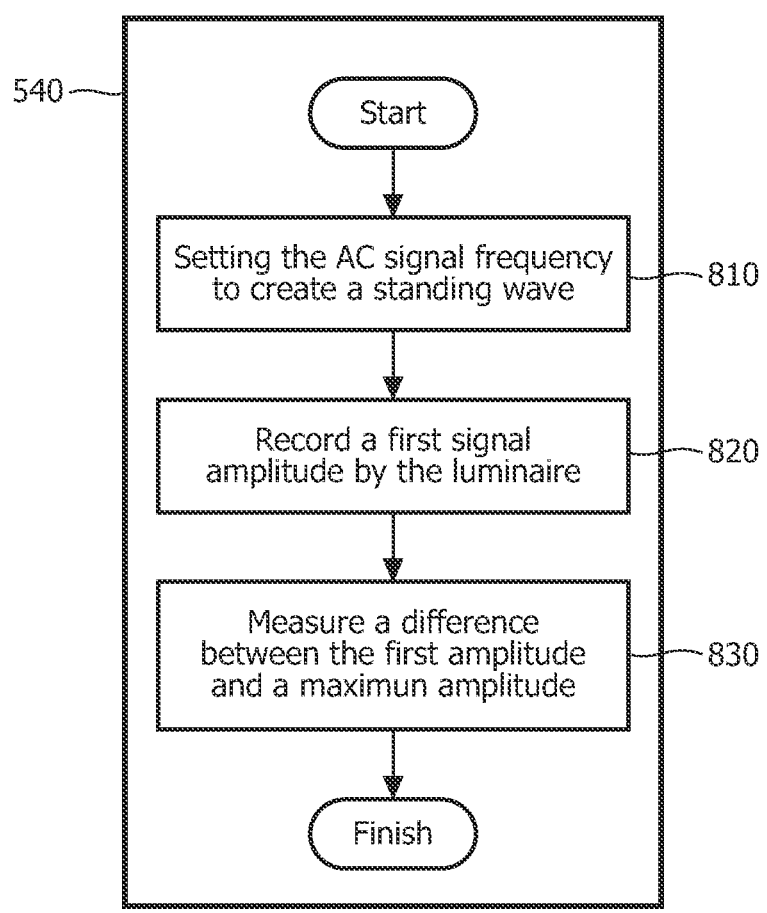
FIG. 8 is a flowchart of a second embodiment of a method for locating a luminaire on a DC power grid.

FIG. 8 is a flowchart expanding and detailing block 540 of FIG. 5 for a second embodiment of a luminaire location method. The second embodiment calculates the distance of the luminaire from the AC signal generator based upon the differences in amplitude of a signal at different locations along the transmission line, or rail. Under the second embodiment, the AC signal generator transmits a standing wave, for example, a sine wave, across a DC power rail, as shown by block 810. The frequency of the AC signal is adjusted to create a standing wave having a node at the signal generator. An amplitude of the AC signal is recorded at the luminaire, as shown by block 820. A difference between the first amplitude and the maximum amplitude is calculated, as shown by block 830.

Figure 9:
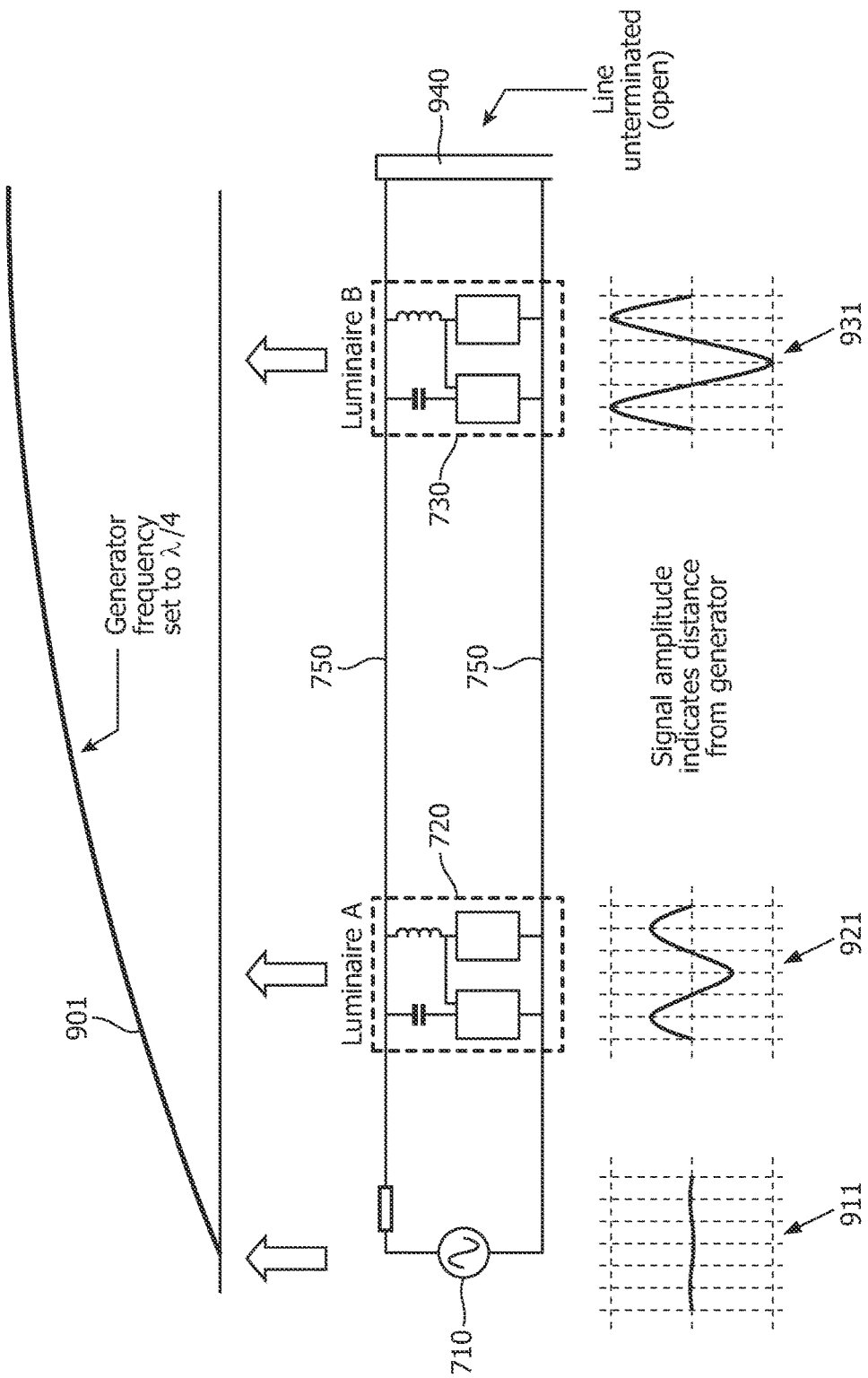
FIG. 9 is a schematic diagram of a second embodiment of a method for locating a luminaire on a DC power grid.

FIG. 9 illustrates an example of signals received at the first luminaire 720 and the second luminaire 730 under the second embodiment, measuring amplitude differences across a standing wave. In this case the grid line 750 is unterminated 940, that is, the circuit appears open to the high frequency signal 901, such that the signal 901 is reflected at the end of the line causing standing waves across the transmission line 750. If the frequency of the signal 901 at the signal generator 710 is adjusted to be a quarter wavelength, as shown, the amplitude of the signal 901 increases from an amplitude of zero at the generator 710 to a maximum amplitude at the unterminated line end 940. The luminaires 720, 730 store the maximum value of the signal 901 waveform that they detect, for example by using an onboard ADC, and may report the amplitude after the initial measurement period, for example, to a DC grid mapper or room controller (not shown). Luminaire 720, 730 positions may be determined by comparing the relative amplitudes.

While the signal 901 is represented as a quarter wavelength, there is no objection to using other frequencies, for example, a half or eighth wavelength, or to taking subsequent measurements using different wavelengths. This may assist in more accurately determining the position of a luminaire positioned near the unterminated end. Similarly, subsequent measurements may be taken using a wavelength having a maximum amplitude at the signal generator 710 and a node at the unterminated end 940. Under some embodiments, the AC signal generator may be adjustable to select a frequency appropriate to produce a standing wave according to the length of the rail. Once determined, the frequency may be stored by the AC generator for subsequent measurements.

Embodiment 3: Time to NULL (Frequency Sweep)

Figure 10:
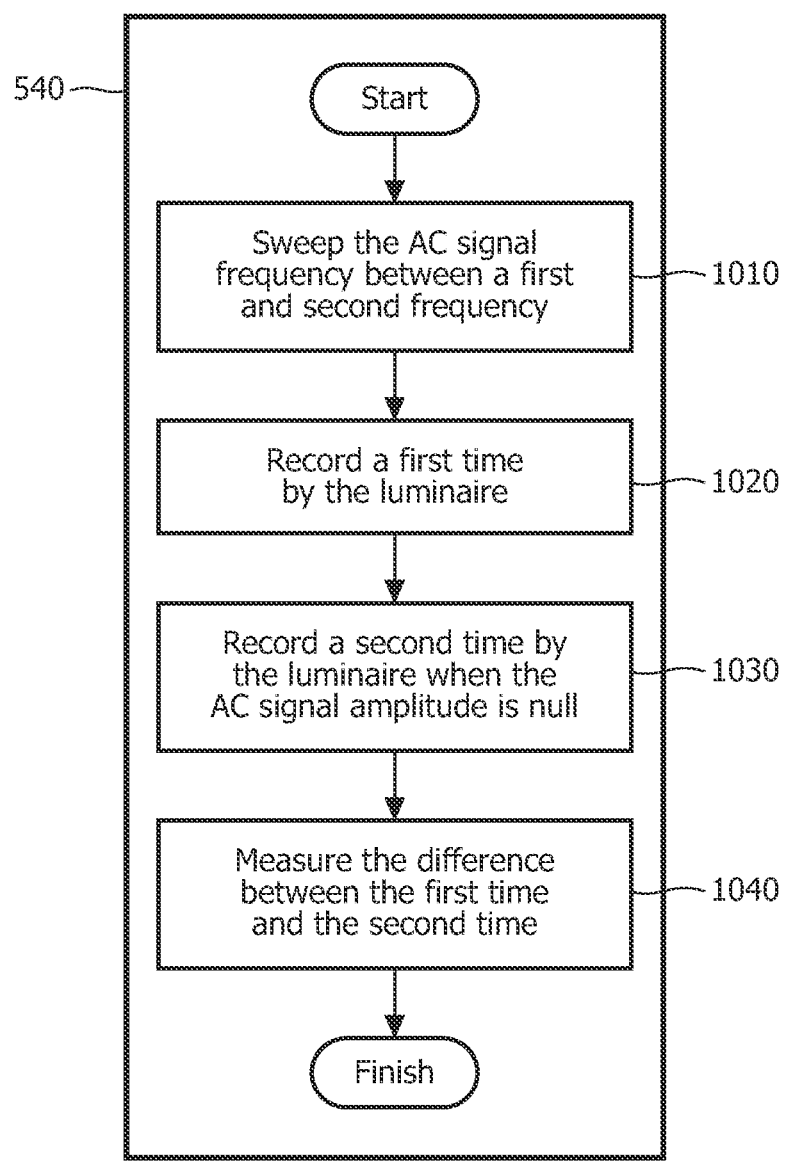
FIG. 10 is a flowchart of a third embodiment of a method for locating a luminaire on a DC power grid.

FIG. 10 is a flowchart expanding and detailing block 540 of FIG. 5 for a third embodiment of a luminaire location method. The third embodiment calculates the distance of the luminaire from the AC signal generator based upon the frequency of signal where a node is detected along the transmission line, or rail. Under the third embodiment, the AC signal generator transmits a swept frequency waveform, for example, a sine wave, across a DC power rail, as shown by block 520 (FIG. 5). The frequency of the AC signal is adjusted across a range, as shown by block 1010, for example from a high frequency to a low frequency, or from a low frequency to a high frequency. The luminaire records a first time, corresponding to when the generator begins transmitting the swept signal, as shown by block 1020. The amplitude of the AC signal is detected at the luminaire, and the time is recorded when the amplitude detected at the luminaire is null, as shown by block 1030. A difference between the first amplitude and the maximum amplitude is calculated, as shown by block 1040.

When a high frequency signal is transmitted along an unterminated transmission line, an amplitude null occurs on the transmission line at locations according to the length of the transmission line and the frequency of the high frequency signal. If the length of the transmission line is known, the position of an amplitude null on the transmission line may be used to determine the distance of the null from the end of the transmission line. Therefore, if a null is detected at a point along a transmission line, for example, a luminaire along a DC power rail of known length, the distance of the luminaire from the end of the DC power rail may be determined.

Figure 11:
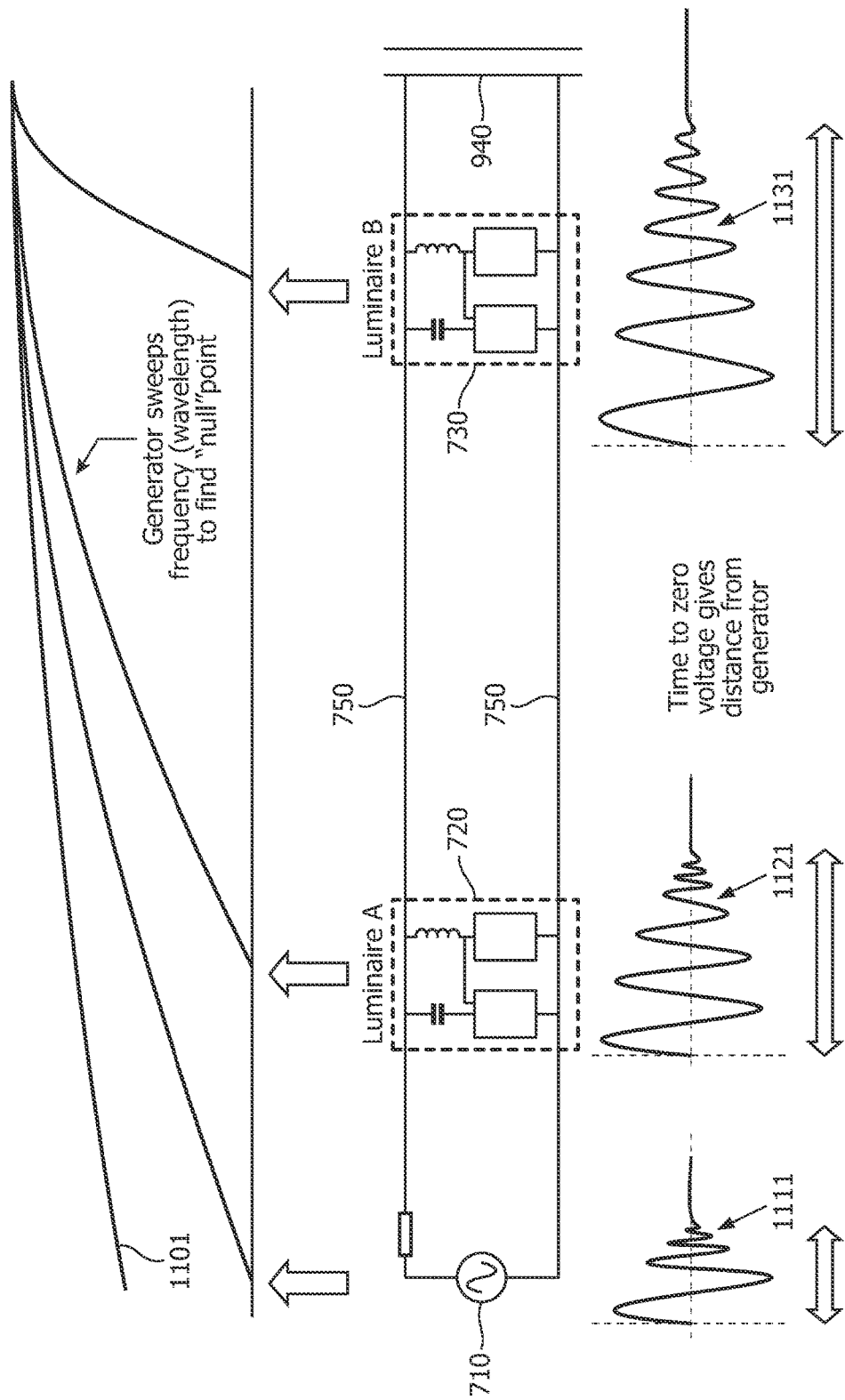
FIG. 11 is a schematic diagram of a third embodiment of a method for locating a luminaire on a DC power grid.

FIG. 11 illustrates an example of signals received at the first luminaire 720 and the second luminaire 730 under the third embodiment measuring the time difference between the initiation of a location signal and the detection of a null as the frequency of the signal is swept. The lines 750 are unterminated 940. The time taken at a luminaire 720, 730 on the line 750 for the signal to decay to zero is a measure of the position of the luminaire 720, 730 from the end of the line 750. The luminaires 720, 730 may store the result of the time measurement locally and report it back to the infrastructure after the measurement, for example, when the luminaire 720, 730 receives a measurement query message. The distance between the AC signal generator 710 and the luminaire 720, 730 may be calculated, for example, by determining the frequency of the swept signal at the time the luminaire 720, 730 reported a null amplitude.

As shown by the example in FIG. 11, The AC signal generator 710 may transmit a first frequency 1011 at time $t_1$ and decrease the frequency of the AC signal at a constant rate. The first luminaire 720 may detect a null at a time $t_2$ corresponding to a second frequency 1121. The time $t_2$ may be used to determine the second frequency 1121 the AC signal generator 710 was transmitting at time $t_2$, and thus the distance between the first luminaire 720 and the AC signal generator 710 may be determined. Similarly, the second luminaire 730 may detect a null at a time $t_3$ corresponding to a third frequency 1131. The time $t_3$ may be used to determine the third frequency 1131 the AC signal generator 710 was transmitting at time $t_3$, and thus the distance between the second luminaire 730 and the AC signal generator 710 may be determined.

It should be noted that while the above example the AC signal generator 710 and the luminaires 720, 730 synchronize timing of the swept signal based upon the time the swept signal starts, there is no objection to other methods of timing synchronization familiar to a person having ordinary skill in the art, so that the frequency 1121, 1131 of the signal at the time a null is detected by a luminaire 720, 730 may be determined.

Embodiment 4: Pulse Spacing

Figure 12:
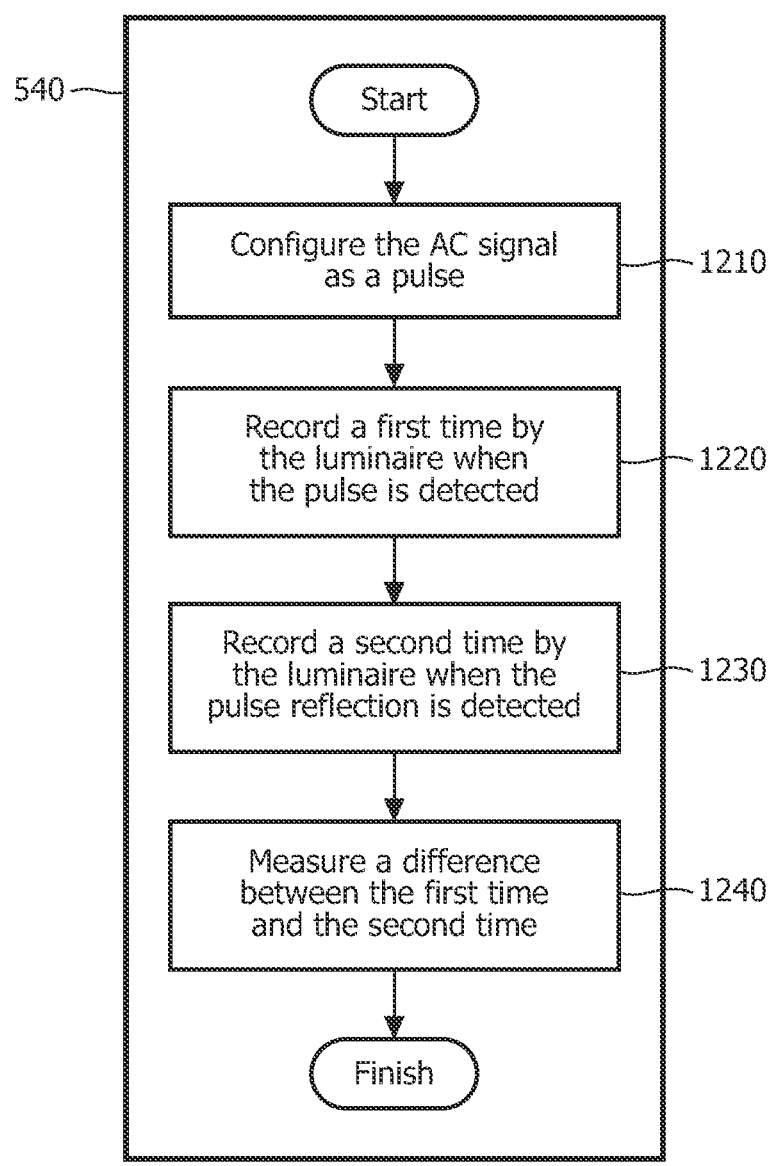
FIG. 12 is a flowchart of a fourth embodiment of a method for locating a luminaire on a DC power grid.

FIG. 12 is a flowchart expanding and detailing block 540 of FIG. 5 for a fourth embodiment of a luminaire location method. The fourth embodiment calculates the distance of the luminaire from the AC signal generator based upon the propagation time of signal along the transmission line, or rail. Under the fourth embodiment, the AC signal generator configures the AC signal as a pulse, as shown by block 1210, for example, a unit step function, and transmits the pulse across a DC power rail, as shown by block 520 (FIG. 5). The luminaire records a first time, corresponding to when the pulse propagates to the luminaire, as shown by block 1220. When the pulse reaches the end of the unterminated transmission line, the pulse is reflected back toward the AC signal generator. The luminaire records a second time, corresponding to when the reflected pulse propagates to the luminaire, as shown by block 1230. A difference between the first time and the second time is calculated, as shown by block 1240. The distance of the luminaire to the end of the transmission line may be calculated, for example, by multiplying the time difference and the propagation speed of the pulse, and then dividing by two, to account for the time of the pulse to propagate from the luminaire to the end of the rail, and then back from the end of the rail to the luminaire.

Figure 13:
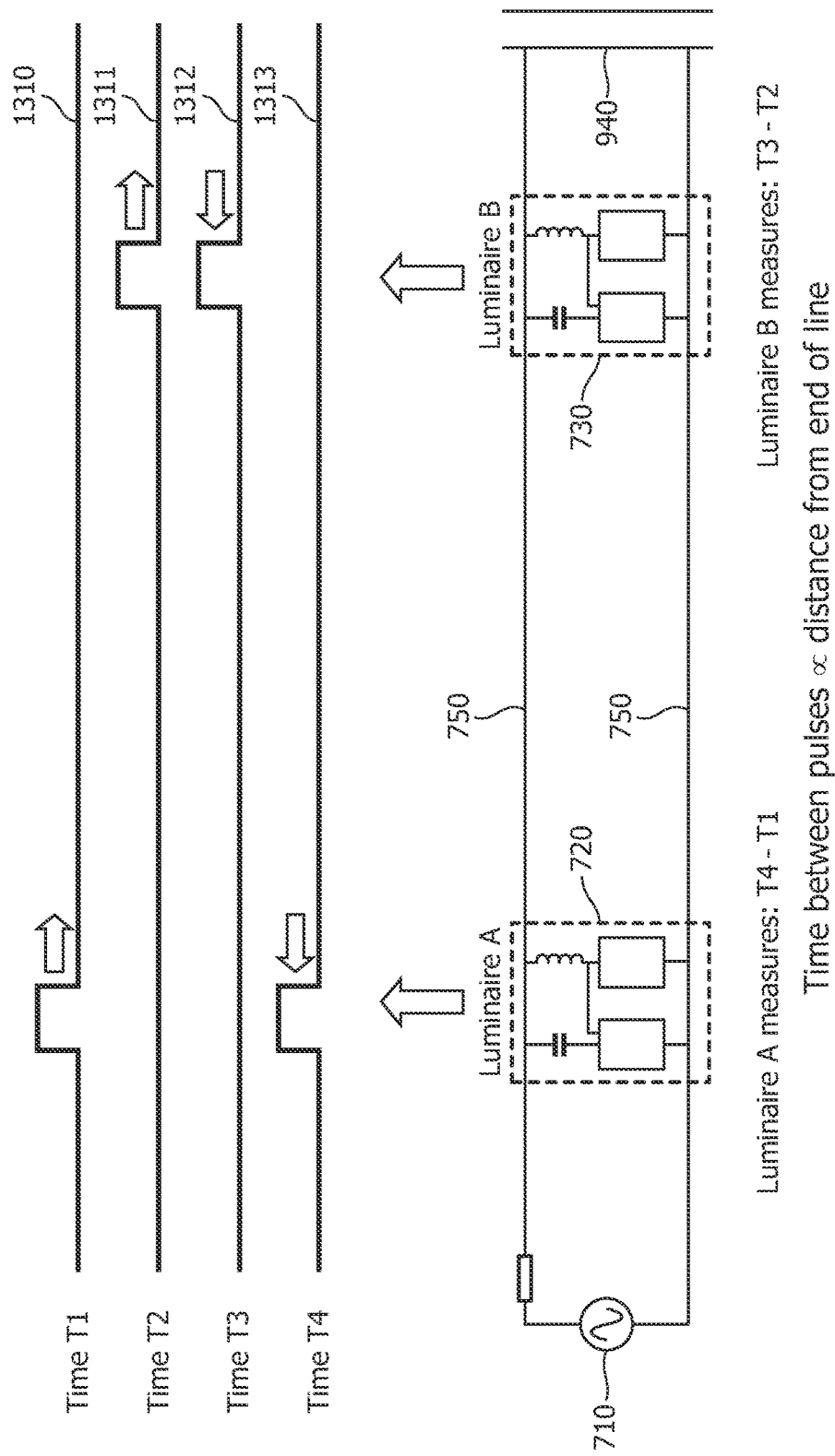
FIG. 13 is a schematic diagram of a fourth embodiment of a method for locating a luminaire on a DC power grid.

FIG. 13 shows a transmission line based location method that utilizes pulses transmitted along the line 750 rather than, for example, continuous high frequency sine waves. As in the second and third embodiment, the line 740 is unterminated causing reflections at the end 940. Positions of luminaires 720, 730 along the line 750 may be determined by recording the elapsed time between a pulse passing the luminaires 720 while travelling from the generator 710 towards the end of the line 940 and the time when the reflected pulse passes the luminaires 720, 730 again. In particular, the pulse is detected at the first luminaire 720 at time $t_1$ 1310, the pulse is detected at the second luminaire 730 at time $t_2$, the reflected pulse is detected at the second luminaire 730 at time $t_3$, and the reflected pulse is detected at the first luminaire at time $t_4$. The location of the first luminaire 720 along the line 750 may be determined using the difference between $t_1$ and $t_4$, while the location of the second luminaire 730 along the line 750 may be determined using the difference between $t_2$ and $t_3$.

It should be noted that the AC signal generator described in the first, second, third and fourth embodiments may be a stand-alone signal transmitter in communication with a signal transmitter and/or transceiver, or may be incorporated within a signal transmitter and/or transceiver.

DC Rail Communications Channel

As mentioned above, the AC generator may be used to convey control data or other information with one or more luminaires within the lighting system. Like the location signals described above, the communications channel uses the DC power distribution rails to convey communications signals across the rails. It may be desirable to choose a carrier frequency for the communication channel sufficiently low that each luminaire along the rail receives a signal with a substantially consistent signal to noise ratio regardless of the position of the luminaire along the rail. The communications channel may occupy a distinct frequency band from the location signals, for example, using frequency division multiplexing. For example, the location channel may have a carrier frequency approximately in the 5 MHz range, while the communication channel may operate approximately in the 1 MHz range. Of course, there is no objection to using the communication channel over DC power distribution rails with other channelization techniques used in wired channels, for example, time division multiplexing.

The communications channel conveyed by the DC power distribution rails may be used to supplant or augment other communications channels used by the luminaires, for example Zigbee wireless channels. For example, a DC mapper may be in communication with a transceiver sending location and/or data communications to luminaires, and receiving location and/or data communications from luminaires.

The luminaire location calculation may be performed by centralized processing, distributed processing, or by a combination of centralized and distributed processing. For example, luminaires may gather data based on received location signals, and communicate the data to a DC grid mapper, for example co-located with the signal generator, wherein the DC grid mapper calculates the luminaire location based upon the data received from the luminaires in conjunction with information regarding the position of the DC grid lines. In another example, the luminaires may calculate the distance between the luminaires and the source of the location signals, and communicate this distance to the DC grid mapper. Similarly, the DC grid mapper may provide the DC grid position information to the luminaires, so the luminaires may calculate their position relative to the DC grid. A person having ordinary skill in the art will recognize variations on the luminaire location method and system that fall within the scope of this disclosure.

The method and system for identifying and locating luminaires on a DC power grid may be used, for example, to aid auto-commissioning of lighting systems by automatically obtaining spatial mapping from a deployment within a lighting installation. The luminaire location information provided may then be leveraged by other applications such as scene setting. In addition to first time commissioning, the ID can also be used to aid automatic configuration or re-configuration of lighting systems when, for example, a luminaire is added to or removed from a pre-existing installation.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

It should also be understood that, unless clearly indicated to the contrary, in any methods claimed herein that include more than one step or act, the order of the steps or acts of the method is not necessarily limited to the order in which the steps or acts of the method are recited.

Also, reference numerals appearing in parentheses in the claims, if any, are provided merely for convenience and should not be construed as limiting in any way.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The invention claimed is:

1. A method for locating a luminaire on a DC grid, the DC grid comprising a first DC grid power line, an AC signal generator switchably connected to the first DC grid power line, and a first luminaire in electrical communication with the first DC grid power line, the first luminaire disposed along the first DC grid power line at a first distance from the AC signal generator, the method comprising the steps of:
   connecting the AC signal generator to the first DC grid power line;
   transmitting, by the AC signal generator, an AC signal along the first DC grid power line;
   receiving the AC signal by the first luminaire; and
   calculating the first distance between the AC signal generator and the first luminaire, based in part upon the AC signal.

2. The method of claim 1, where the first DC grid power line is terminated for the AC signal with a resistance approximating a characteristic impedance of the first DC grid power line, the method further comprising the steps of:
   recording, by the first luminaire, a first phase of the AC signal at the first luminaire; and
   recording, by the AC signal generator, a second phase of the AC signal at the AC signal generator;
   wherein the step of calculating the first distance further comprises measuring a difference between the first phase and the second phase.

3. The method of claim 1, wherein the first DC grid power line is unterminated for the AC signal, the method further comprising the steps of:
   setting the frequency of the AC signal such that the AC signal forms a standing wave across the first DC grid power line, the standing wave comprising a maximum amplitude; and
   recording, by the first luminaire, a first amplitude of the AC signal at the first luminaire;
   wherein the step of calculating the first distance further comprises measuring a difference between the first amplitude and the maximum amplitude.

4. The method of claim 1, wherein the first DC grid power line is unterminated for the AC signal, the AC signal further comprising an amplitude, the method further comprising the steps of:
   sweeping the frequency of the AC signal between a first frequency and a second frequency;
   recording, by the first luminaire, a first time corresponding to a time the first luminaire initially detects the AC signal; and
   recording, by the first luminaire, a second time corresponding to a time the first luminaire detects the amplitude of the AC signal corresponding to a null amplitude;

wherein the step of calculating the first distance further comprises measuring a difference between the first time and the second time.

5. The method of claim 1, wherein the AC signal comprises a pulse signal, the first DC grid power line is unterminated for the AC signal, the method further comprising the steps of:
recording, by the first luminaire, a first time corresponding to a time the first luminaire initially detects the pulse signal; and
recording, by the first luminaire, a second time corresponding to a time the first luminaire initially detects a reflection of the pulse signal;
wherein the step of calculating the first distance further comprises measuring a difference between the first time and the second time.

6. The method of claim 1, wherein the DC grid further comprises a second DC grid power line, the AC signal generator switchably connected to the second DC grid power line, and a second luminaire in electrical communication with the second DC grid power line, the second luminaire disposed along the second DC grid power line at a second distance from the AC signal generator, the method further comprising the steps of:
connecting the AC signal generator to the second DC grid power line;
transmitting, by the AC signal generator, an AC signal along the second DC grid power line;
receiving the AC signal by the second luminaire; and
calculating the second distance between the AC signal generator and the second luminaire, based in part upon the AC signal.

7. The method of claim 1, wherein the DC grid further comprises a memory, the method further comprising the steps of:
storing the first distance in the memory; and
communicating the first distance to a DC grid mapper.

8. The method of claim 7, wherein the step of communicating the first distance to the DC grid mapper further comprises the step of transmitting a wireless signal to the DC grid mapper.

9. The method of claim 7, wherein the memory is disposed within the first luminaire, the DC grid mapper is in electrical communication with the DC grid, and the step of communicating the first distance to a DC grid mapper further comprises the step of transmitting a communication signal along the first DC grid power line from the first luminaire to the DC grid mapper.

10. The method of claim 1, further comprising the steps of:
assigning a first identifier to the first luminaire; and
communicating the first identifier between the first luminaire and the AC signal generator.

11. The method of claim 10, wherein the step of communicating the first identifier further comprises the step of transmitting a wireless signal to the DC grid mapper.

12. The method of claim 10, wherein the DC grid mapper is in electrical communication with the DC grid, and wherein the step of communicating the first identifier further comprises the step of transmitting a communication signal along the first DC grid power line from DC grid mapper to the first luminaire.

13. The method of claim 1, wherein the DC grid further comprises an EMerge Alliance Standard-compliant lighting system.

14. The method of claim 1, further comprising recording a property of said AC signal at said first luminaire, wherein the calculating the first distance is based at least in part on the recorded property of said AC signal at said first luminaire.

* * * * *